United States Patent
Siergiej et al.

[11] Patent Number: 5,903,020
[45] Date of Patent: May 11, 1999

[54] SILICON CARBIDE STATIC INDUCTION TRANSISTOR STRUCTURE

[75] Inventors: Richard R. Siergiej, Irwin; Anant K. Agarwal, Monroeville; Rowland C. Clarke, Saltsburg; Charles D. Brandt, Mt. Lebanon, all of Pa.

[73] Assignee: Northrop Grumman Corporation

[21] Appl. No.: 08/877,847

[22] Filed: Jun. 18, 1997

[51] Int. Cl.⁶ ................................................ H01L 29/80
[52] U.S. Cl. .......................... 257/264; 257/266; 257/279; 257/495; 257/77
[58] Field of Search ............................. 257/77, 263, 264, 257/266, 275, 495, 136, 279

[56] References Cited

U.S. PATENT DOCUMENTS

| | | | |
|---|---|---|---|
| 3,911,473 | 10/1975 | Nienhuis | 257/495 |
| 4,470,059 | 9/1984 | Nishizawa et al. | 257/264 |
| 5,385,855 | 1/1995 | Brown et al. | 257/77 X |
| 5,391,895 | 2/1995 | Dreifus | 257/77 |
| 5,539,217 | 7/1996 | Edmond et al. | 257/77 |
| 5,612,547 | 3/1997 | Clarke et al. | 257/77 |
| 5,629,531 | 5/1997 | Palmour | 257/77 |
| 5,663,582 | 9/1997 | Nishizawa et al. | 257/136 |
| 5,753,938 | 5/1998 | Thapar et al. | 257/77 |

OTHER PUBLICATIONS

T. Shino, et al., "New SIT Structure Exceeds 10W at 2 GHz," Microwaves, Feb. 1980, pp. 48–53.

Primary Examiner—John Guay
Attorney, Agent, or Firm—Walter G. Sutcliff

[57] ABSTRACT

A static induction transistor having a silicon carbide substrate upon which is deposited a silicon carbide layer arrangement. The layer arrangement has a plurality of spaced gate regions for controlling current flow from a source region to a drain region vertically spaced from the source region by a drift layer. The pitch distance p between gate regions is 1 to 5 microns and the drift layer thickness d is also 1 to 5 microns.

In one embodiment the source regions are positioned alternatively with the gate regions and are formed in a top layer of high doping concentration. In another embodiment the gate regions are ion implanted in the layer arrangement.

In another embodiment the structure includes a dual oxide layer covering gate and source or drain regions, and in yet another embodiment contacts for the drain, source and gate regions are located on the same side of the substrate member.

14 Claims, 7 Drawing Sheets

SILICON CARBIDE STATIC INDUCTION TRANSISTOR STRUCTURE

CROSS REFERENCE TO RELATED APPLICATIONS

The present application is related in subject matter to the following, all of which are assigned to the assignee of the present application:

Ser. No. 08/462,405 filed Jun. 5, 1995 now U.S. Pat. No. 5,612,547

Ser. No. 08/708,447 filed Sep. 5, 1996 now U.S. Pat. No. 5,705,830

Ser. No. 08/817,227 filed Mar. 6, 1997 a continuation of Ser. No. 08/544,626 filed Oct. 18, 1995

BACKGROUND OF THE INVENTION

1. Field of the Invention

The invention in general relates to semiconductor structures, and more particularly to a silicon carbide static induction transistor capable of high frequency, high power operation.

2. Description of Related Art typical static induction transistor is a vertical structure device wherein active carriers flow from a source region to a drain region on opposite sides of a substrate member. Current flowing from source to drain is controlled by an electrostatic potential barrier induced by gate regions positioned on either side of the source region. The static induction transistor has a d.c. current-voltage characteristic similar to a vacuum tube triode and is relatively linear over a wide range of drain current values.

Static induction transistors are typically made of silicon and can operate at frequencies up to approximately 1 GHz and can handle maximum power densities of less than about 12 kW/cm$^2$. A plurality of such static induction transistors are generally interconnected in an array to provide a desired function such as a radar transmitter. There is a need for static induction transistors which can operate at much higher frequencies and at significantly higher power densities than silicon static induction transistors. The present invention provides for such need with a device operable at the higher frequencies and power levels desired. This is accomplished with fewer transistors accommodated within a smaller package than comparable silicon static induction devices providing the same function.

SUMMARY OF THE INVENTION

A static induction transistor in accordance with the present invention includes a silicon carbide substrate member having a silicon carbide layer arrangement formed thereon, with the layer arrangement having one or more silicon carbide layers of predetermined dopings. A plurality of laterally spaced ion implanted gate regions are defined in the layer arrangement and a plurality of either source or drain regions are positioned alternately with respective ones of said gate regions, with the other of the source or drain regions being vertically displaced from the gate regions.

The minimum thickness of the layer arrangement between the gate region and the drain region constitutes a drift layer which has a thickness d of from 1 to 5 microns. The pitch distance p between the laterally displaced gate regions is approximately 1 to 5 microns and the width y of the layer arrangement between the gate regions is approximately 0.25 to 3.0 microns. Respective electrical contacts are positioned on said drain, source and gate regions. In one embodiment the drain, source and gate contacts are positioned on the same side of the substrate member to allow for a thinner substrate member.

A relatively thin thermally grown protective oxide layer covers the gate regions and whichever of the source or drain regions positioned alternately with respective ones of the gate regions. A relatively thick oxide layer is deposited over the thermally grown protective oxide layer and windows are formed through both oxide layers for making electrical contact with the regions covered by the oxide layers.

DESCRIPTION OF THE PREFERRED EMBODIMENTS

In the following FIGS., which are not necessarily to scale, like or corresponding parts are denoted by like or corresponding reference numerals throughout.

Figure 1:
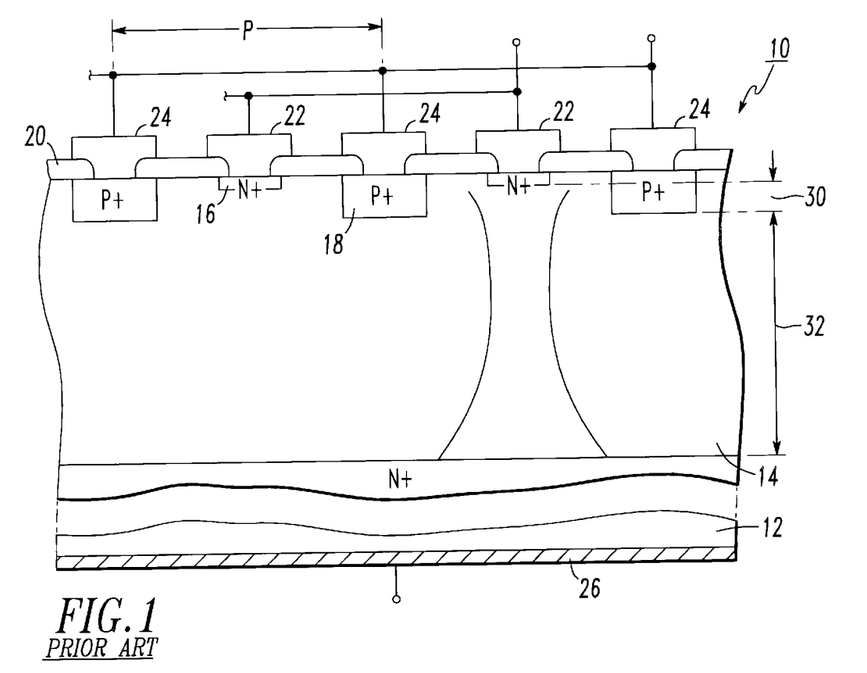
FIG. 1 is a sectional view of a silicon static induction transistor structure of the prior art.

FIG. 1 represents a portion of a conventional silicon static induction transistor having an n$^+$ substrate 12, defining a drain region for collecting electrons, and upon which is deposited an n$^-$ layer 14. Formed within the layer 14, by diffusion techniques are a plurality of n$^+$ source regions 16, extending perpendicular to the plane of the FIG., for supplying electrons, and being in an alternating relationship with a plurality of p$^+$ gate regions 18, also extending perpendicular to the plane of the FIG. A thick oxide layer 20 covering layer 14 has a series of windows formed therethrough for making electrical contact with the source and drain regions by means of commonly connected metal source contacts 22 and commonly connected metal gate contacts 24. A metal drain contact 26 is also provided and covers the surface of substrate 12 opposite layer 14.

In operation, each pair of gate regions 18 on either side of a source region 16, modulate the flow of electrons through a vertical region 30, after which the electrons drift to the drain 12, through a drift layer 32, in a current profile roughly depicted by numeral 34.

A typical silicon static induction transistor as illustrated in FIG. 1 has a drift layer thickness d of at least 10 $\mu$m (microns) or greater and a pitch p, or distance between gate regions, of at least 7 $\mu$m. Critical performance parameters as applied to static induction transistors include on-state current maximum, $I_{max}$, blocking voltage, $V_{block}$, cut-off frequency, $f_t$, and maximum frequency of oscillation, $f_{max}$. The first two parameters determine the output power of the device at the operating frequency and the last two parameters determine the useable frequency range.

To a good approximation, the current $I_{max}$ is inversely proportional to the thickness d of the drift layer, as is the cut-off frequency $f_t$ whereas the blocking voltage is directly proportional to the thickness of the drift layer and the breakdown critical field of the semiconductor material. This may be demonstrated by the following equations:

$$I_{max} \approx AqN_d\mu_n \frac{V_D}{d} \qquad (1)$$

$$V_{block} \approx E_c d \qquad (2)$$

$$f_t \approx \frac{1}{2\pi}\left(\frac{V_{sat}}{d}\right) \qquad (3)$$

where A is the minimum cross-sectional area of the current flow, q is the electron charge, $N_d$ is the doping density in the drift layer 32, $\mu_n$ is the electron mobility, $V_D$ is the drain voltage bias, d is the thickness of the drift layer 32, $E_c$ is the critical electric field, and $V_{sat}$ is the saturated drift velocity.

In class B operation of an amplifier, the output current is cut off at zero input signal and a half wave rectified output is produced. Two transistors are utilized to duplicate the input waveform, each one conducting for half of the input cycle. The power output for class B operation, utilizing the above parameters is given as:

$$P_{out} = \frac{V_{block}I_{max}}{8} = \frac{1}{8}AqN_d\mu_n V_D E_C \qquad (4)$$

rearranging to obtain power output per unit area:

$$\frac{P_{out}}{A} = \frac{1}{8}qN_d V_D(\mu_n E_c) \qquad (5)$$

A comparison of silicon and silicon carbide electronic properties is given in the following table 1:

TABLE 1

|  | Si | 4-H SiC |
|---|---|---|
| Critical breakdown field, $E_c$ (MV/cm) | 0.3 | 3.0 |
| Electron mobility, $\mu_n$ (cm²/Vs) | 1400 | 700 |
| Saturated electrol velocity, $V_{sat}$ cm/sec | $1 \times 10^7$ | $2 \times 10^7$ |
| Thermal conductivity (W/cm K) | 1.0 | 4.9 |

In general, the blocking voltage is the maximum voltage that can be applied between source and drain before excessive current flows, due to breakdown phenomena. A relatively high blocking voltage is desired for greater output power at a given frequency, and from equation (2) this may be accomplished by increasing the thickness d of the drift layer. Increasing d, however, from equation (1), reduces the maximum current $I_{max}$. From TABLE 1 and equation (2) it may be seen that for the same blocking voltage, the drift layer thickness d for silicon carbide may theoretically be 10 times thinner than for silicon due to the difference in critical breakdown fields (3.0 vs 0.3 MV/cm). A thinner drift layer in the silicon carbide will allow for a greater maximum current as well as a higher cut-off frequency, $f_t$ as set out in equation (3).

From a power standpoint, the term in parenthesis in equation (5) is 5 times higher for silicon carbide than for silicon (2100 vs 420) so that the power per unit area is greater, thus allowing for smaller packaging requirements with fewer transistors. The thermal conductivity of the silicon carbide aids in removing excess heat generated at these higher powers.

Figure 2:
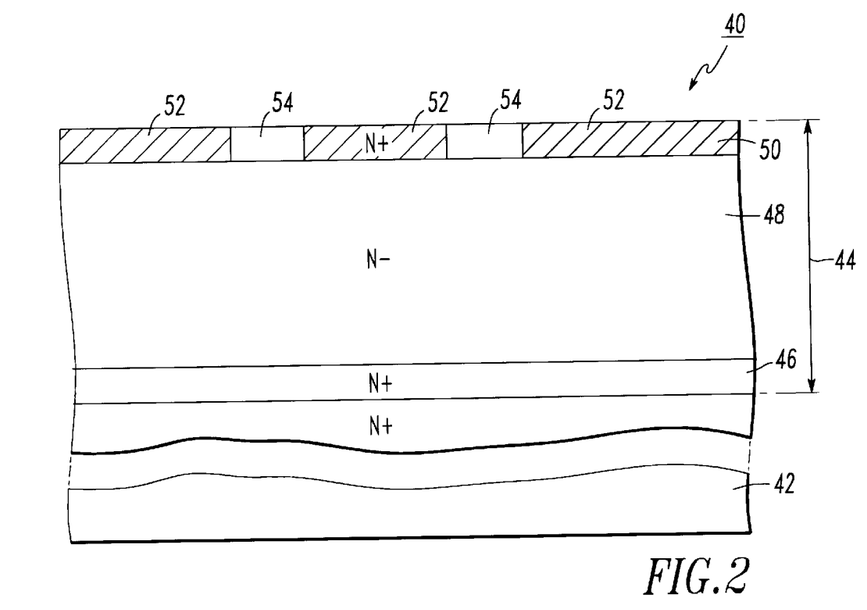
FIG. 2 shows a silicon carbide static induction transistor structure in accordance with one embodiment of the invention, in the initial stages of fabrication.
Figure 3:
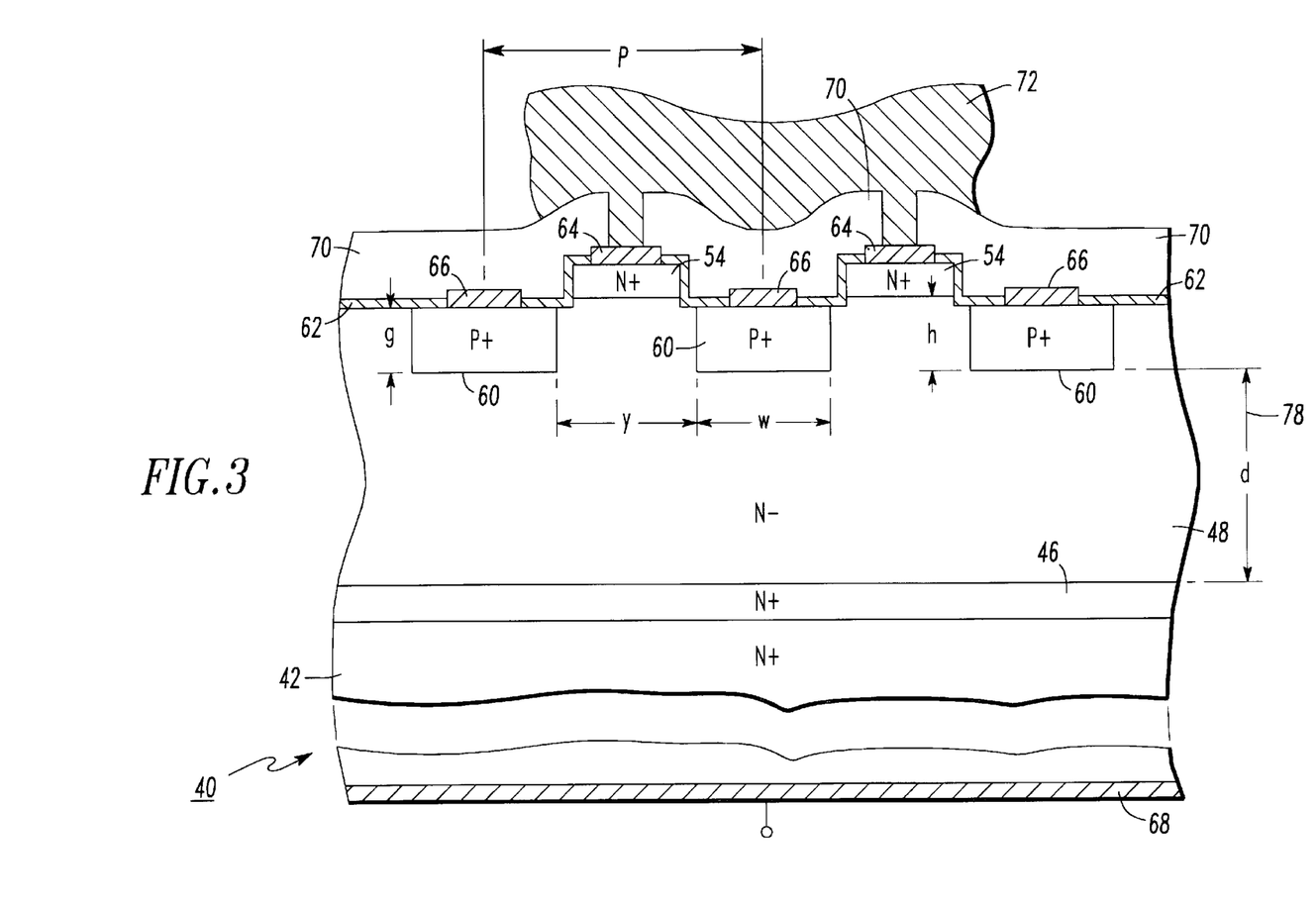
FIG. 3 illustrates the completed structure.

A silicon carbide transistor structure, in accordance with one embodiment of the present invention, is illustrated in FIGS. 2 and 3. FIG. 2, showing the transistor structure 40 in an early stage of fabrication, includes an n⁺ substrate member 42 of silicon carbide. The silicon carbide substrate may be a 4H polytype as well as other polytypes including, but not limited to, the 3C, 2H, 6H and 15R polytypes.

A silicon carbide layer arrangement 44, having one or more layers, is deposited upon the substrate 42 by epitaxial growth techniques such as vapor phase epitaxy during which process intentional impurity atoms of a dopant are added, as desired, to produce layers with predetermined dopant levels and conductivities.

The substrate member 42, cut from a grown silicon carbide boule, generally will have slight imperfections in its surface which could lead to a breakdown during transistor operation. Accordingly, a silicon carbide n⁺ buffer layer 46 may be deposited to provide a transition from a relatively high electric field in the drift layer to a relatively low electric field in the substrate 42.

The next two layers are constituted by a silicon carbide n⁻ layer 48, which will contain a drift layer, and a silicon carbide n⁺ top layer 50 which has the highest dopant level of all the layers and from which will be formed the source regions of the transistor. By way of example, buffer layer 46, grown to a thickness of about 0.5 $\mu$m, has a dopant level of $1 \times 10^{18}$ cm⁻³ (atoms per cubic centimeter). Layer 48, grown to a thickness of about 1.25 to 6.5 $\mu$m, has a dopant level of $1 \times 10^{15}$ to $2 \times 10^{16}$ cm⁻³, and top layer 50, grown to a thickness of about 0.5 $\mu$m, has a dopant level of $1 \times 10^{20}$ to $5 \times 10^{20}$ cm⁻³. The dopant for these epitaxial layers may be nitrogen.

By known masking, photolithographic, etching etc. techniques, portions 52 of layer 50 are removed, as is about 1000 Å of layer 48, leaving a plurality of spaced apart portions 54 which extend as fingers perpendicular to the plane of the FIG. and which will form the source regions of the completed transistor structure.

As seen in FIG. 3 the completed transistor structure 40 includes a plurality of spaced apart p⁺ gate regions 60 alternating laterally with source regions 54, and also extending as fingers perpendicular to the plane of the FIG. Gate regions 60 are not formed by diffusion, as is done in silicon, because the process would require detrimental temperatures in excess of 2000° C. Accordingly, gate regions 60, of width w, are formed within layer 48 by means of a series of ion implantation steps, with for example, boron or aluminum ions. The implantation is carried out at various energy levels and to a depth g of about 0.25 to 1.5 $\mu$m. With the source and gate regions as illustrated, the substrate 42 then functions as the drain for the transistor.

In order to reduce or eliminate undesired surface charges, a protective thermal oxide 62 such as high quality silicon dioxide is grown by a pyrogenic method over the exposed surface of the structure at a temperature of about 1150° C. for 2 hours and annealed in argon for 30 minutes. Thereafter the protective oxide 62 is selectively removed to allow for the deposition of source contacts 64, gate contacts 66 and drain contact 68. For the source and drain, such deposition may be nickel, by way of example. The structure is then annealed in an argon-hydrogen mixture at 1150° C. for a couple of minutes to form an alloy with nickel and elements in the silicon carbide regions 54. For the gate contacts, multiple stacks of aluminum/titanium layers may be deposited and thereafter annealed to alloy the metalization.

A relatively thick oxide layer, for example 1am, is desired to act as a field insulator. The protective oxide 62 is grown to a thickness of about 500 Å in a 2 hour period. To continue such growth to a thickness of 1 $\mu$m (10,000 Å) would consume an excessive amount of time. Accordingly a second, and low temperature oxide layer 70 is deposited, as opposed to grown, upon thermal oxide layer 62 to a thickness of about 9,500 Å. Windows are then formed in the thick oxide layer 70 to allow for common electrical connection to a metalization layer 72, for the source contacts 64, thereby forming a single source connection. A similar metalization layer is provided for the gate contacts 66, however it is located at the distal ends of the gate regions, out of the plane of the FIG.

A region 76 of thickness h, wherein electrons supplied by the source region are modulated, is defined between the gate regions 60, and a drift layer 78 of thickness d is defined by the minimum distance between a gate region 60 and the drain 42. If a buffer layer such as 46 is provided, the drift layer would extend to the top of that layer, as illustrated. In the present invention the drift layer has a thickness d of approximately 1 to 5 $\mu$m resulting in a blocking voltage value, as defined in equation (2), equal to that of a silicon static induction transistor having an order of magnitude thicker drift layer of 10 to 50 $\mu$m. In addition, the thinner drift layer presents less resistance and allows for a greater maximum current to flow through the device.

Figure 3A:
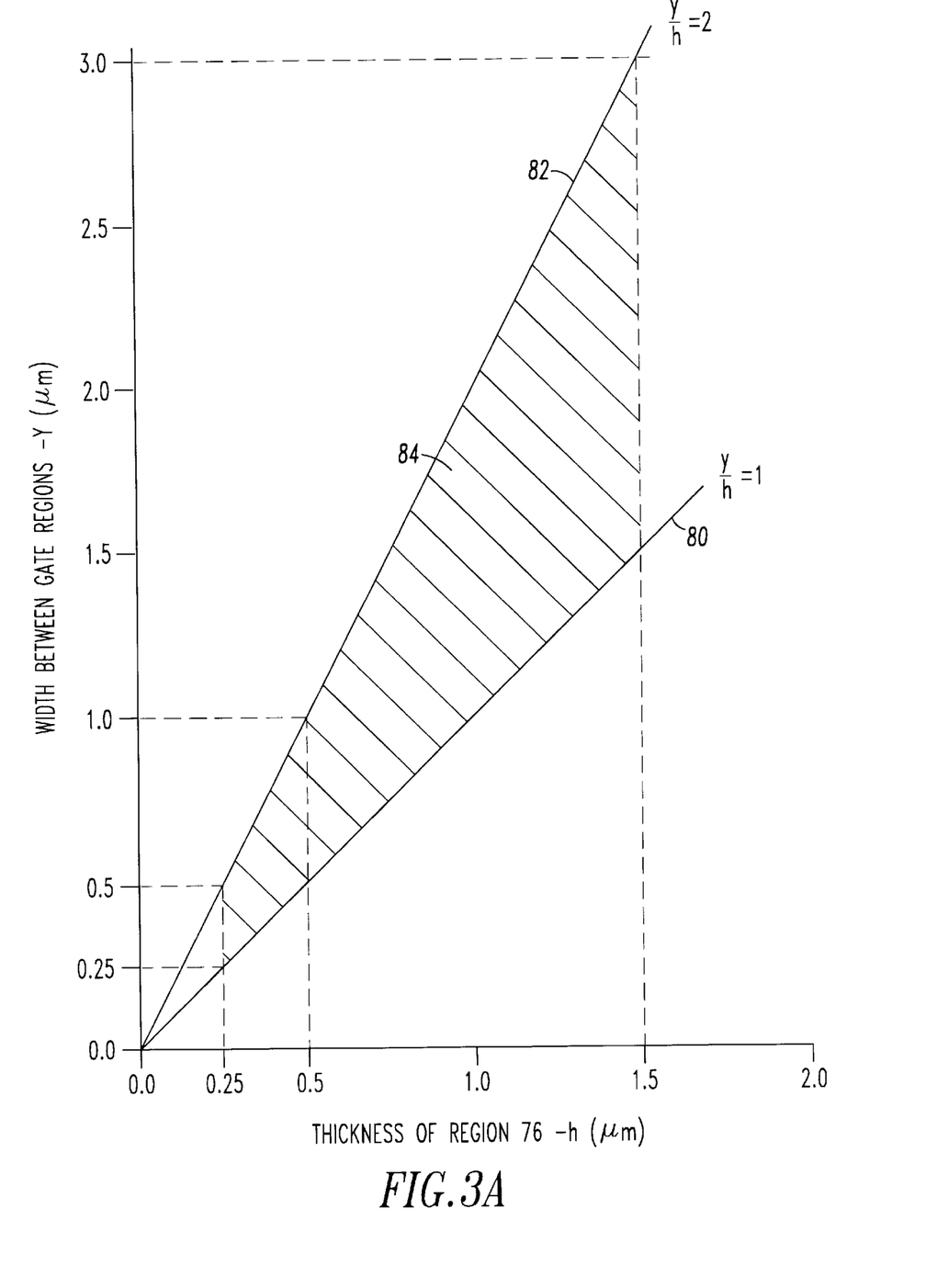
FIG. 3A are curves illustrating certain dimension restrictions for practicing the present invention.

In FIG. 3 the distance between gate regions 60, from center to center, is designated by the pitch p. The present invention allows for a smaller pitch than conventional static induction transistors and by way of example p is in the range of about 1 to 5 $\mu$m. The gate regions 60 are illustrated in idealized form. In actuality, the ion implanted regions may curve or bulge at the lower end thereof. Width y, defined as the minimum distance between gate regions 60, ranges, in the present invention, from about 0.5 to 3.0 $\mu$m and the thickness h of region 76, which is the maximum vertical distance between a source and gate region, ranges from 0.25 to 1.5 $\mu$m. Otherwise stated, the ratio of y/h ranges from 1 to 2. The relationship between these values is illustrated in FIG. 3A wherein the thickness h of region 76 is plotted on the horizontal axis and the gap, or width y between gate regions 60, is plotted on the vertical axis. The ratio of y/h=1 is plotted as curve 80 and the ratio of y/h=2 is plotted as curve 82. With the maximum and minimum values previously given, the transistor structure may be fabricated with dimensions as defined by the shaded area 84 between the curves 80 and 82. In general, with a smaller gap distance y the gate regions exert more control over the current than does the drain, and higher gain is achievable for the same bias conditions.

In addition to forming the drain region for the transistor, the substrate 42 also acts as a support for the silicon carbide epitaxial layers deposited thereon. The thickness of a typical silicon carbide substrate 42 may range from about 250 to 350 $\mu$m. The electrical resistance of a relatively thick substrate tends to limit the power efficiency of the transistor and accordingly, it is desired to make the substrate as thin as practical, both from an electrical standpoint as well as a thermal standpoint. To this end reference is made to FIG. 4 illustrating another embodiment of the present invention.

Figure 4:
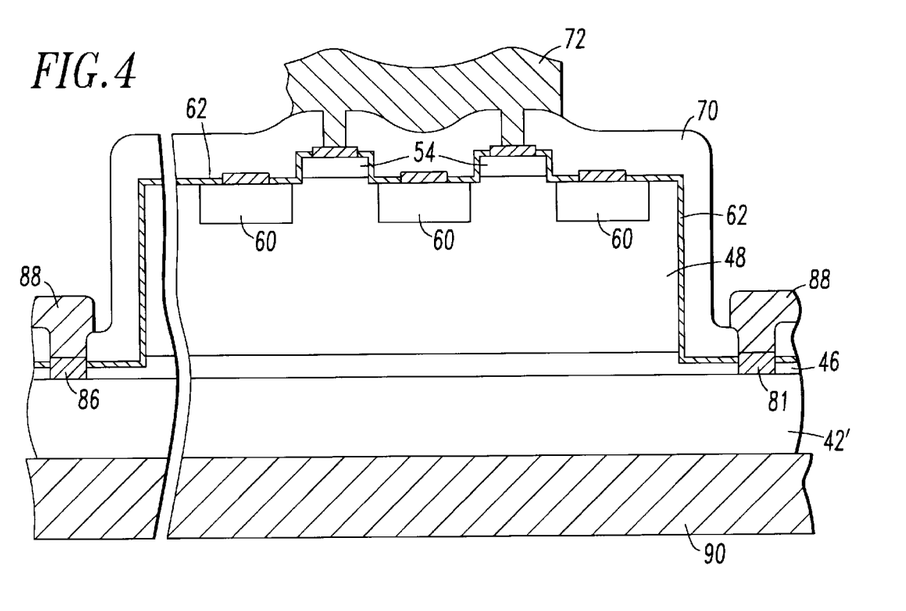
FIG. 4 illustrates another embodiment of the present invention.

In FIG. 4, a drain contact is positioned on the same side of a substrate member as the source and gate contacts. More particularly, a drain contact 86, formed through a window in thermal oxide layer 62 and deposited oxide layer 70, surrounds the source and gate finger arrangement and makes electrical contact with the substrate member 42'. A metalization layer 88 may then be applied over the oxide layer 70 for electrical connection to the drain contact 86. With this design, the substrate may be much thinner than the substrate 42 illustrated in FIG. 3 and can be bonded to a thermal conductor 90, whereby heat generated during operation may be efficiently extracted, resulting in better thermal management. In addition, the current, which essentially flows vertically through layer 48 now only has to flow a short distance (tens of microns) transversely to the surrounding drain contact 86 instead of through the substrate (hundreds of microns). The total distance traveled by the electrons may be 10 times less with the arrangement of FIG. 4, and as such, less heat is generated during operation.

In the embodiment of FIG. 3, the vertical distance h of region 76 between the source and bottom of the gate region, should be at least 0.25 to 1.5 $\mu$m to obtain reasonable voltage gain, for example, greater than 10. However, if the pitch p is reduced to approximately $\leq 2$ $\mu$m, the width y may be reduced to the range of 0.3 to 1.5 $\mu$m, with the thickness h then having a corresponding range of 0.15 to 1.2 $\mu$m, in accordance with the curves of FIG. 3A. In such case an implanted source region, as illustrated in FIG. 5 may be employed.

Figure 5:
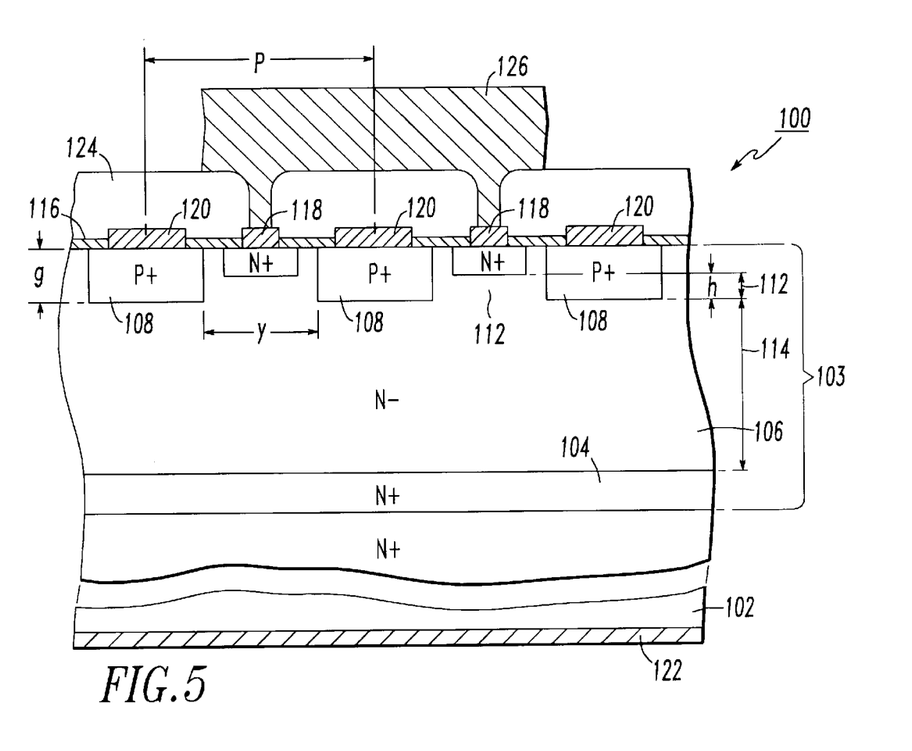
FIG. 5 illustrates an embodiment of the invention wherein both source and gate regions are ion implanted.

In FIG. 5 the transistor structure 100 includes an $n^+$ silicon carbide substrate 102 and a silicon carbide layer arrangement 103, which includes an $n^+$ buffer layer 104 and an $n^-$ layer 106, both deposited by techniques previously described. $P^+$ gate regions 108 are formed by ion implantation to a depth g and $n^+$ source regions 110, alternating laterally with gate regions 108, are also formed by ion implantation into layer 106. The ion implanted gate and source regions 108 and 110 define, in layer 106, a region 112 of thickness h, the maximum vertical distance between a source and gate region. By way of example, if the device is fabricated with a minimum thickness h of 0.25 $\mu$m for region 112, then, from FIG. 3A, the gap or width y should be no more than 0.5 $\mu$m and no less than 0.25 $\mu$m for satisfactory operation. If the device is fabricated with a thickness h of 0.5 $\mu$m for region 112, then the width y should be no more than 1.0 $\mu$m and no less than 0.5 $\mu$m. The drift layer 114, as before, ranges from 1 to 5 $\mu$m.

In a manner similar to the embodiment of FIG. 3, the transistor structure 100 includes a grown thermal protective oxide 116 through which portions are selectively removed for deposition of respective source, gate and drain contacts 118, 120 and 122. Covering the thermal oxide 116 is a deposited oxide layer 124 having windows for making electrical connection of a metalization layer 126 with source contacts 118. A similar metalization layer is provided for the gate contacts, however it is located at the distal ends of the gate regions, out of the plane of the Figure.

Figure 6:
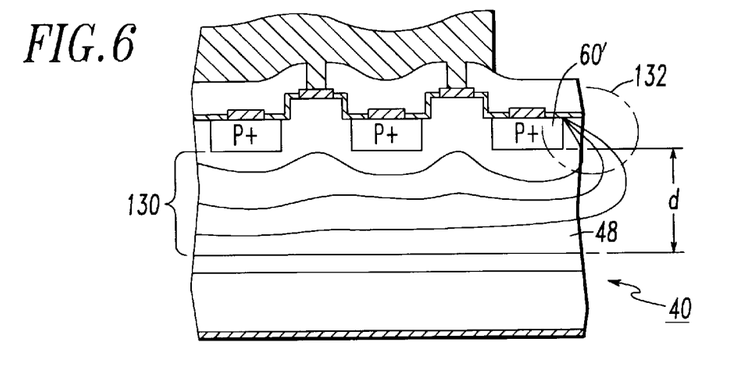
FIG. 6 shows the device of FIG. 3 together with electric field equipotential lines occurring during operation.

FIG. 6 duplicates the transistor structure of FIG. 3 and illustrates a plurality of equipotential field lines 130 which exist during operation. It is desired that the transistor device have as high a blocking voltage as possible since more power can then be output at a particular frequency. The blocking voltage is a function of drift layer distance d as well as critical breakdown field $E_c$, listed in TABLE 1. The actual value for $E_c$ is reduced however by the excessive electric field concentration at the edge gate region 60' in area 132 which causes a premature breakdown at the gate-drift layer interface.

Figure 7:
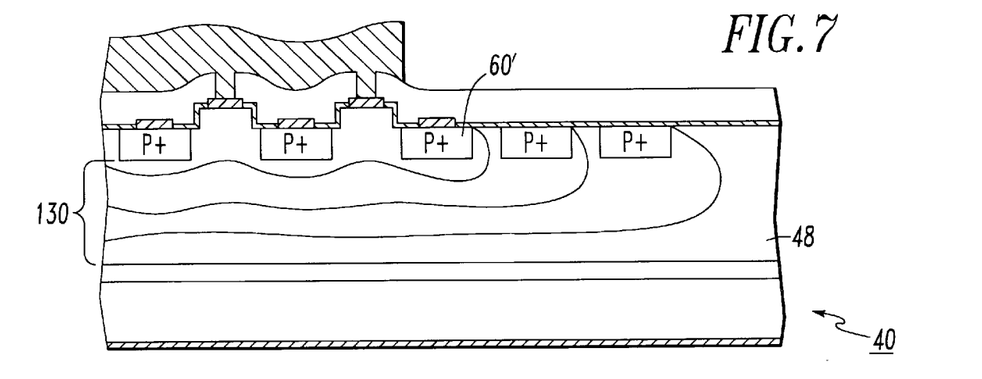
FIGS. 7 and 8 illustrate embodiments of the invention for reducing objectionable concentration of electric field equipotential lines.
Figure 8:
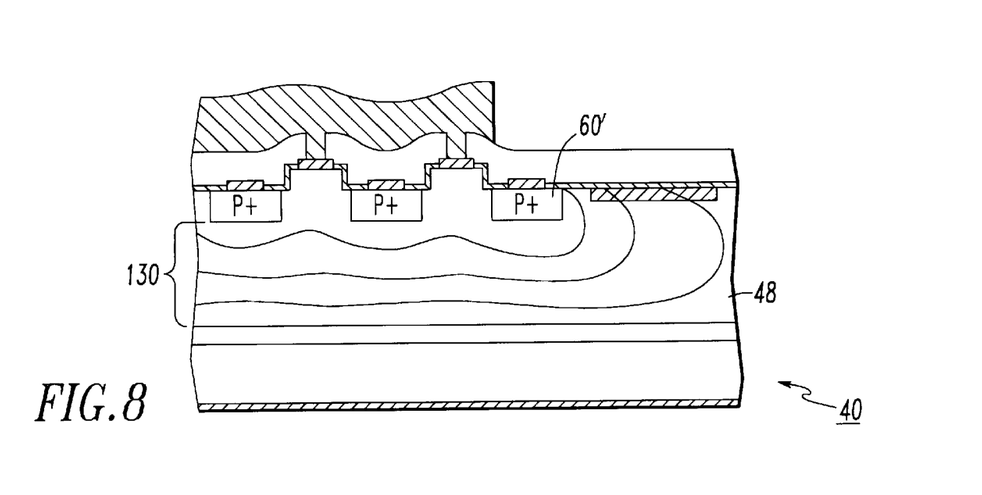

FIGS. 7 and 8 illustrate an arrangement for reducing electric field concentration at the edge gate region, thus allowing for a greater actual critical breakdown field $E_c$ and a greater blocking voltage for a given drift layer. This is accomplished in FIG. 7 by the inclusion of a plurality of guard rings of p+ conductivity, ion implanted into layer 48, in a manner similar to the-gate regions, however, without the electrical connections. The guard rings 134, of which two are illustrated, completely surround all of the source and gate regions of the transistor structure 40. The ion implanted guard rings 134 function to spread out the equipotential electric field lines 130, as illustrated, to reduce any undesired concentration at the edge gate region 60'.

FIG. 8 illustrates another means for reducing the electric field concentration at the edge gate region 60' so as to allow for a greater blocking voltage. In FIG. 8 an ion implantation 136 of, for example, argon into layer 48 and surrounding all of the source and gate regions, will also function to spread out the equipotential electric field lines 130, as illustrated, to reduce any undesired concentration at the edge gate region 601.

Figure 9:
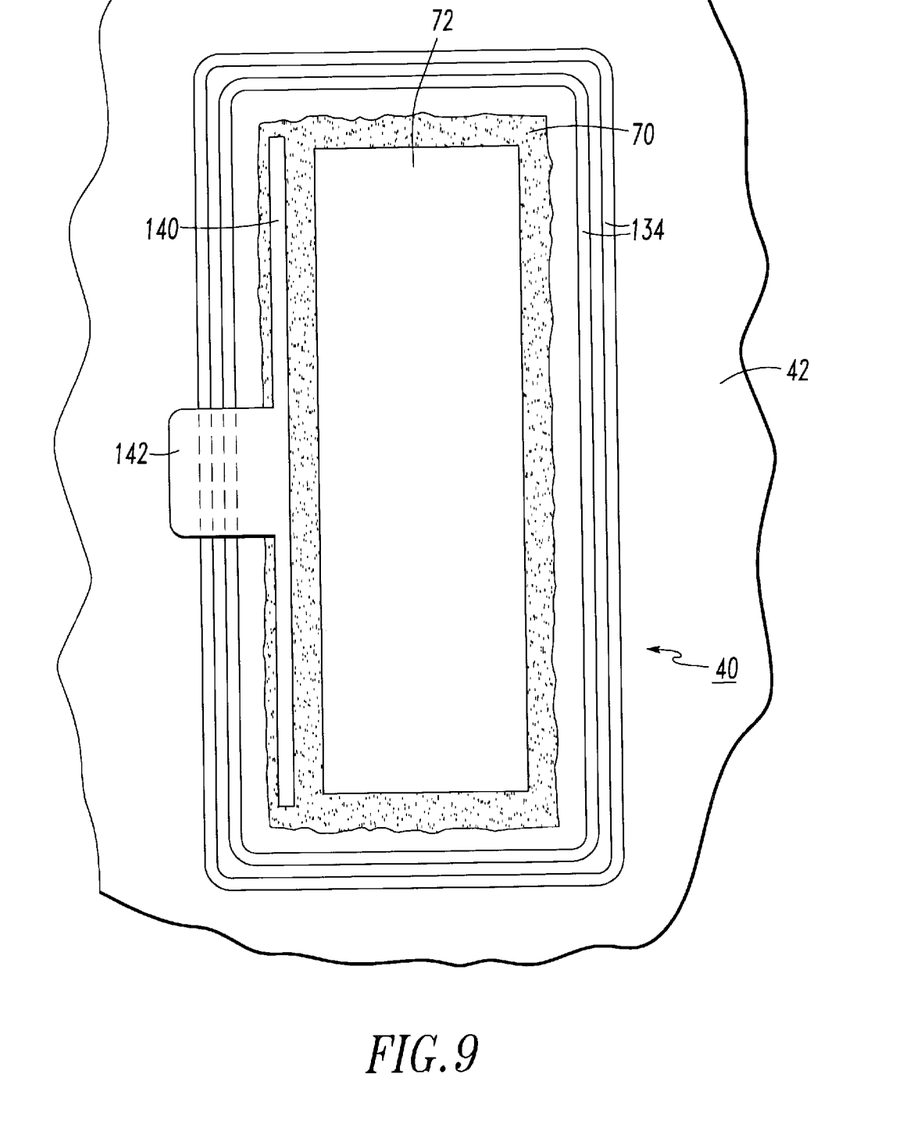
FIG. 9 is a plan view of the structure of FIG. 7.

FIG. 9 is a plan view of different levels of the transistor structure 40 of FIG. 7 and illustrates the guard rings 134 surrounding all of the source and gate regions, which would be located below oxide layer 70. The gate regions are electrically connected together by means of a gate bus 140 connected to gate tab 142. The transistor structure 40 is formed along with a plurality of similar structures on a common wafer substrate 42 and is interconnected with a selected number of such structures by means of electrical wiring (not shown) bonded to respective metalization layers 72 and gate tabs 142 to operate as a unitary transistor for high power microwave applications.

Figure 10:
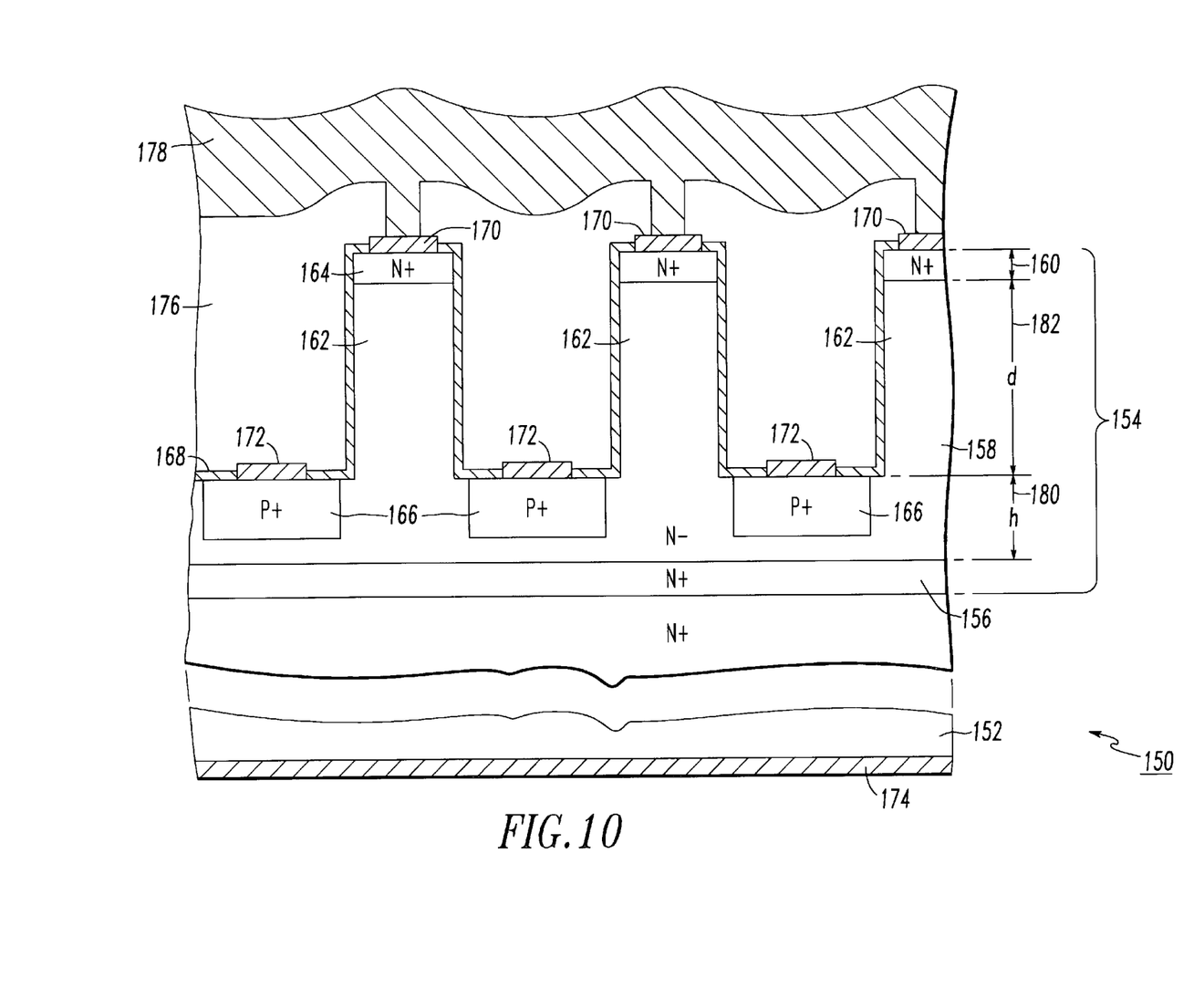
FIG. 10 illustrates another embodiment of the invention.

Another way in which the electric field concentration may be reduced is by the silicon carbide static induction transistor structure illustrated in FIG. 10. Basically in the structure of FIG. 10 the position of the source and drain regions are interchanged. More particularly, transistor structure 150 includes an n+ substrate 152 upon which is deposited a silicon carbide layer arrangement 154 consisting of an n+ buffer layer 156, an n− second layer 158 and an n+ top layer 160.

Layers 158 and 160 are etched, by known techniques, in a manner to define a plurality of mesa fingers 162 on top of which, formed from layer 160 (portions of which have been removed), are respective drain regions 164. Gate regions 166 of p+ conductivity are ion implanted in layer 158 between mesas 162 to control the flow of electrons supplied by the substrate 152 which acts as the source in this embodiment. The transistor structure 150 is completed as before with the growing of a protective thermal oxide 168, through which windows are formed to allow for deposition of respective drain, gate and source contacts 170, 172 and 174. A low temperature oxide layer 176 is deposited as the next step and suitable windows are formed for connection of the drain contacts 170 with metalization layer 178.

With the construction of FIG. 10, a region 180, having a thickness h of about 0.25 to 1.5 $\mu$m, is defined by the maximum vertical distance between a gate region 166 and the source buffer layer 156. A drift layer 182, ranging from about 1.0 to 5.0 $\mu$m is defined by the minimum vertical distance d between the gate region 166 and a drain region 164. When operating potential is applied, most of the electric field is confined in the mesa structures 162, resulting in less field crowding thereby allowing the transistor to approach its theoretical critical breakdown field value, $E_c$.

A transistor structure as illustrated in FIG. 3 was fabricated in accordance with the teachings herein and parameters were measured at low S-band conditions (1.2 GHz). The fabricated device exhibited a drain-to-source breakdown voltage in excess of 200 V. The device showed a maximum transconductance of about 100 mSiemens/cm, and a 2 cm package generated 28 watts of output power with a drain efficiency of about 49% and a gain of 7.5 dB. This demonstrates a power density of 75 kW/cm$^2$, which is about six times more than can be achieved from silicon devices.

Although the present invention has been described with a certain degree of particularity, it is to be understood that various substitutions and modifications may be made without departing from the spirit and scope of the invention as defined in the appended claims.

What is claimed is:

1. A silicon carbide static induction transistor structure comprising:
   (A) a silicon carbide substrate member having a silicon carbide layer arrangement formed thereon, said layer arrangement having one or more silicon carbide layers of predetermined dopings;
   (B) a plurality of laterally spaced ion implanted gate regions defined in said layer arrangement;
   (C) (i) a plurality of source regions defined in said layer arrangement, each of said plurality of source regions being positioned alternately with respective ones of said gate regions, and (ii) a drain region vertically displaced from said gate regions;
   (D) the minimum thickness of said layer arrangement between said gate region and said drain region constituting a drift layer;
   (E) the pitch distance p between said laterally displaced gate regions being approximately 1 to 5 microns;
   (F) the width V of said layer arrangement between said gate regions being approximately 0.25 to 3.0 microns;
   (G) the thickness d of said drift layer being approximately 1 to 5 microns;
   (H) respective electrical contacts positioned on said drain, source and gate regions; and wherein
   (I) the maximum vertical distance h between said source and gate regions is approximately 0.25 to 1.5 microns.

2. A structure according to claim 1 wherein:
   (A) said layer arrangement includes a buffer layer adjacent said substrate member.

3. A structure according to claim 2 wherein:
   (A) said drift layer is constituted by that portion of said layer arrangement between said gate region and said buffer layer.

4. A structure according to claim 1 wherein:
   (A) the ratio of y/h ranges from 1 to 2.

5. A structure according to claim 1 which includes:
   (A) an ion implanted guard region defined in said layer arrangement and surrounding said plurality of gate regions.

6. A structure according to claim 5 wherein:
   (A) said ion implanted guard region is constituted by a plurality of concentric rings.

7. A silicon carbide static induction transistor structure comprising:
   (A) a silicon carbide substrate member having a silicon carbide layer arrangement formed thereon, said layer arrangement having one or more silicon carbide layers of predetermined dopings;
   (B) a plurality of laterally spaced ion implanted gate regions defined in said layer arrangement;
   (C) (i) a plurality of drain regions defined in said layer arrangement, each of said plurality of drain regions being positioned alternately with respective ones of said gate regions, and (ii) a source region vertically displaced from said gate regions;

(D) the minimum thickness of said layer arrangement between said gate region and said drain region constituting a drift layer;

(E) the pitch distance p between said laterally displaced gate regions being approximately 1 to 5 microns;

(F) the width y of said layer arrangement between said gate regions being approximately 0.25 to 3.0 microns;

(G) the thickness d of said drift layer being approximately 1 to 5 microns;

(H) respective electrical contacts positioned on said drain, source and gate regions; and wherein (I) the maximum vertical distance h between said source and gate regions is approximately 0.25 to 1.5 microns.

8. A structure according to claim 7 wherein:

(A) the ratio of y/h ranges from 1 to 2.

9. A structure according to claim 7 which includes:

(A) an ion implanted guard region defined in said layer arrangement and surrounding said plural etc of gate regions.

10. A structure according to claim 9 wherein:

(A) said ion implanted guard region is constituted by a plurality of concentric rings.

11. A silicon carbide static induction transistor structure comprising:

(A) a silicon carbide substrate member having a silicon carbide layer arrangement formed thereon, said layer arrangement having one or more silicon carbide layers of predetermined dopings;

(B) a plurality of laterally spaced ion implanted gate regions defined in said layer arrangement;

(C) (i) a plurality of drain regions defined in said layer arrangement, each of said plurality of drain regions being positioned alternately with respective ones of said gate regions, and (ii) a source region vertically displaced from said gate regions;

(D) the minimum thickness of said layer arrangement between said gate region and said drain region constituting a drift layer;

(E) the pitch distance p between said laterally displaced gate regions being approximately 1 to 5 microns;

(F) the width y of said layer arrangement between said gate regions being approximately 0.25 to 3.0 microns;

(G) the thickness d of said drift layer being approximately 1 to 5 microns;

(H) respective electrical contacts positioned on said drain, source and gate regions; and wherein (I) said layer arrangement includes a buffer layer adjacent said substrate member; and wherein (J) the maximum vertical distance between said buffer layer and gate regions is approximately 0.25 to 1.5 microns.

12. A structure according to claim 11 wherein:

(A) the ratio of y/h ranges from 1 to 2.

13. A silicon carbide static induction transistor structure comprising:

(A) a silicon carbide substrate member having a silicon carbide layer arrangement formed thereon, said layer arrangement having one or more silicon carbide layers of predetermined dopings;

(B) a plurality of laterally spaced ion implanted gate regions defined in said layer arrangement;

(C) (i) a plurality of ion implanted source regions defined in said layer arrangement, each of said plurality of source regions being positioned alternately with respective ones of said gate regions, and (ii) a drain region vertically displaced from said gate regions;

(D) the minimum thickness of said layer arrangement between said gate region and said drain region constituting a drift layer;

(E) the pitch distance p between said laterally displaced gate regions being approximately 1 to 5 microns;

(F) the width y of said layer arrangement between said gate regions being approximately 0.25 to 3.0 microns;

(G) the thickness d of said drift layer being approximately 1 to 5 microns;

(H) respective electrical contacts positioned on said drain, source and gate regions; and wherein (I) the pitch distance p between laterally spaced gate regions is $\leq 2$ microns.

14. A structure according to claim 13 wherein:

(A) the maximum vertical distance h between said source and gate regions is 0.5 microns.

* * * * *